(12) United States Patent  (10) Patent No.: US 6,621,370 B1
Dao  (45) Date of Patent: Sep. 16, 2003

(54) METHOD AND SYSTEM FOR A LUMPED-DISTRIBUTED BALUN

(75) Inventor: Andy Dao, San Jose, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

(21) Appl. No.: 09/663,560

(22) Filed: Sep. 15, 2000

(51) Int. Cl.[7] .................................................. H01P 5/10
(52) U.S. Cl. ............................. 333/25; 333/26; 333/136
(58) Field of Search ............................. 333/25, 26, 117, 333/118, 125, 128, 136

(56) References Cited

U.S. PATENT DOCUMENTS

| 5,148,130 A | * | 9/1992 | Dietrich | 333/25 |
| 5,644,272 A | * | 7/1997 | Dabrowski | 333/26 |
| 5,861,853 A | * | 1/1999 | Haub et al. | 333/25 |
| 6,091,312 A | | 7/2000 | Sheen | 333/176 |
| 6,150,897 A | | 11/2000 | Nishikawa | 333/26 |

OTHER PUBLICATIONS

Miron, "The LC immittance inverter—simple transmission device design saves time and money in complex transmission systems" (111.rfdesign.com, Jan. 2000, pp. 20–26).

G. D. Vendelin, A. M. Pavio, U. L. Rohde, "Microwave Circuit Design Using Linear and Nonlinear Techniques", 1990, pp. 536–552.

* cited by examiner

Primary Examiner—Benny Lee
(74) Attorney, Agent, or Firm—Pillsbury Winthrop LLP (57) ABSTRACT

Systems to provide and methods to design a printed lumped-distributed balun are presented. A lumped-distributed balun includes a single-ended port, a first differential port, a second differential port, a first phase shifter circuit, and a second phase shifter circuit. The first phase shifter circuit includes a first inductor and a first capacitor. The first inductor is coupled to the single-ended port and the first differential port. The first capacitor is coupled to the first differential port and is adapted to be coupled to ground potential. At least one of the first inductor and the first capacitor is implemented as a transmission line structure, such as microstrip. The second phase shifter circuit includes a second inductor and a second capacitor. The second inductor is coupled to the second differential port and is adapted to be coupled to ground potential. The second capacitor is coupled to the single-ended port and the second differential port. At least one of the second inductor and the second capacitor is implemented as a lumped element.

21 Claims, 8 Drawing Sheets

METHOD AND SYSTEM FOR A LUMPED-DISTRIBUTED BALUN

FIELD OF THE INVENTION

The present invention is directed to a device for balanced to unbalanced line transformation, that is, a balun, and more particularly to a space-optimized balun that utilizes a combination of lumped and distributed circuit elements.

BACKGROUND

Figure 1:
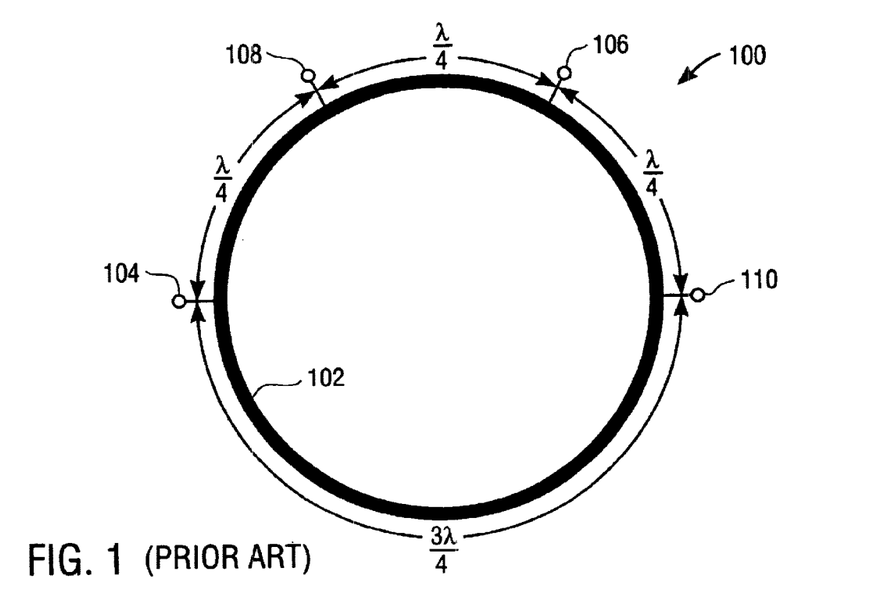
FIG. 1 is a diagram illustrating a ring balun from the prior art.

A balun is a device used to convert between balanced and unbalanced lines for input and output in an electrical system. Special considerations apply to the application of a balun to microwave systems that include printed circuit boards. As is commonly known in the art, FIG. 1 is a diagram illustrating a ring or ratrace design that is used in printed circuit boards. The ring balun 100 is made from microstrip line 102, including a conductive material such as copper. (*Microwave Circuit Design,* G. D. Vendelin, A. M. Pavio, and U. L. Rohde, John Wiley and Sons, 1990).

For the unbalanced line the ring balun 100 includes a single-ended port 104 and an isolation port 106. For the balanced line the ring balun 100 includes a first differential port 108 and a second differential port 110.

The distances along the microstrip 102 between the ports are related to the operational wavelength $\lambda$. As shown in FIG. 1, in a clockwise direction, the distance (measured circumferentially) between the single-ended port 104 and the first differential port 108 is $\lambda/4$, the distance between the first differential port 108 and the isolation port 106 is $\lambda/4$, the distance between the isolation port 106 and the second differential port 110 is $\lambda/4$, and the distance between the second differential port 110 and the single-ended port 104 is $3\lambda/4$. In typical operation, the single-ended port 104 is driven by a signal at an operational frequency f and a 50 ohm ($\Omega$) resistor is attached to the isolation port 106. A differential signal is obtained from difference of the outputs at the first differential port 108 and the second differential port 110. The first differential port 108 and the second differential port 110 together define an open-ended port.

For the ring balun 100 the operational wavelength $\lambda$ is related to the operational frequency f through the following relation:

$$\lambda = \frac{c}{f\sqrt{\varepsilon_r}} \quad (1)$$

where c is the speed of light and $\varepsilon_r$ is a substrate dielectric constant associated with the microstrip 102. Typically the operational frequency f is fixed by the application and the frequency limits design choices for the properties of the microstrip 102.

For example, for the case where f=5.3 GHz and $\varepsilon_r$=3.38 (i.e., the Rogers Corp. substrate material sold under the trademark RO4003®), the circumferential distance between the single-ended port 104 and the first differential port 108 is approximately $\lambda/4$=350 mils. In this case, the ring balun 100 has a diameter of approximately 668 mils and covers an area of approximately 0.35 inch². The ring balun 100 can be approximately contained within a square having a side of length 668 mils and having an area of 0.45 inch².

The desirability of reducing the space occupied by elements on circuit boards has led to limited attempts to reduce the space occupied by the ring balun 100 by some modification of the geometry while keeping the essential features of the design. A difficulty with modifying the geometry of the ring balun 100 may arise due to interference (or coupling) between segments of microstrip that are relatively close together. This interference may adversely affect performance of the ring balun 100.

Figure 2:
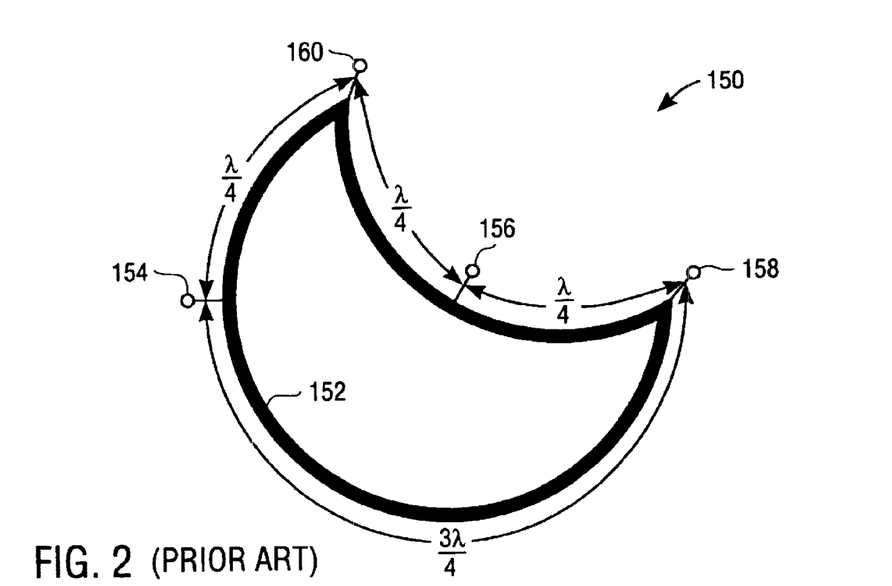
FIG. 2 is a diagram illustrating a modification of the ring balun of FIG. 1.

For example, FIG. 2 shows a modified ring balun 150 also made from microstrip line 152 and also having a single-ended port 154, an isolation port 156, a first differential port 158 and a second differential port 160. The circumferentially measured distances between the ports 154, 156, 158, 160 for the modified ring balun 150 are prescribed in terms of the wavelength $\lambda$ as in the ring balun 100. However, in the modified ring balun 150 the arc between the first differential port 158 and the second differential port 160 is inverted, thereby saving some space on the circuit board while causing minimal interference near the cusps formed at the first differential port 158 and the second differential port 160. However, the improvement in reduced space is minimal since the approximate area of a square that contains the modified balun 150 is still 0.447 inch².

Thus, the requirements for the space taken by a printed balun on a circuit board are driven in part by the desired operational frequency and the physical properties of the microstrip. Attempts to modify the conventional ring balun design have led to limited improvements in minimizing the required area on a circuit board.

SUMMARY OF THE INVENTION

It is therefore an object of the invention to overcome the above-described problems and challenges.

The present invention fulfills this object and others by providing in a first aspect of the present invention a lumped-distributed balun. The lumped-distributed balun includes a single-ended port, a first differential port, a second differential port, a first phase shifter circuit, and a second phase shifter circuit. The first phase shifter circuit includes a first inductor and a first capacitor. The first inductor is coupled to the single-ended port and the first differential port. The first capacitor is coupled to the first differential port and is adapted to be coupled to ground potential. At least one of the first inductor and the first capacitor is implemented as a transmission line structure. The second phase shifter circuit includes a second inductor and a second capacitor. The second inductor is coupled to the second differential port and is adapted to be coupled to ground potential. The second capacitor is coupled to the single-ended port and the second differential port. At least one of the second inductor and the second capacitor is implemented as a lumped element.

A balun according to a presently preferred embodiment is presented in a second aspect of the present invention. The balun performs unbalanced to balanced line transformation. The balun includes a first shifting unit and a second shifting unit. The first shifting unit shifts an input signal having an input phase value to a first output signal having a first output phase value. The first shifting unit includes at least one distributed circuit element. The second shifting unit shifts the first input signal having the input phase value to a second output signal having a second output phase value. The second shifting unit includes at least one lumped circuit element. The first and second output phase values have a difference of 180 degrees.

A lumped-distributed balun according to a presently preferred embodiment is presented in a third aspect of the present invention. The lumped-distributed balun includes a single-ended port, a first differential port, a second differential port, a first microstrip, a second microstrip, a third microstrip, and a lumped element capacitor. The first microstrip is coupled to the single-ended port and the first differential port. The second microstrip is coupled to the first differential port. The second microstrip is open-circuited. The third microstrip is coupled to the second differential port and is adapted to be coupled to ground potential. The lumped element capacitor is coupled to the single-ended port and the second differential port.

A method of designing a printed lumped-distributed balun according to a presently preferred embodiment is presented in a fourth aspect of the present invention. A first network is configured to satisfy balun performance criteria. The first network includes lumped elements. The criteria include a requirement that signal outputs are approximately 180 degrees out of phase. Impedance values for the first network are determined at an operating frequency. A second network is configured in accordance with the impedance values. The second network is configured by replacing at least one of the lumped elements in the first network with a distributed element and by retaining at least one lumped element from the network.

BRIEF DESCRIPTION OF THE DRAWINGS

The foregoing and other features, aspects, and advantages will become more apparent from the following detailed description when read in conjunction with the following drawings, wherein.

DETAILED DESCRIPTION OF THE PREFERRED EMBODIMENTS

The present invention will now be described in detail with reference to the accompanying drawings, which are provided as illustrative examples of preferred embodiments of the present invention.

Figure 3:
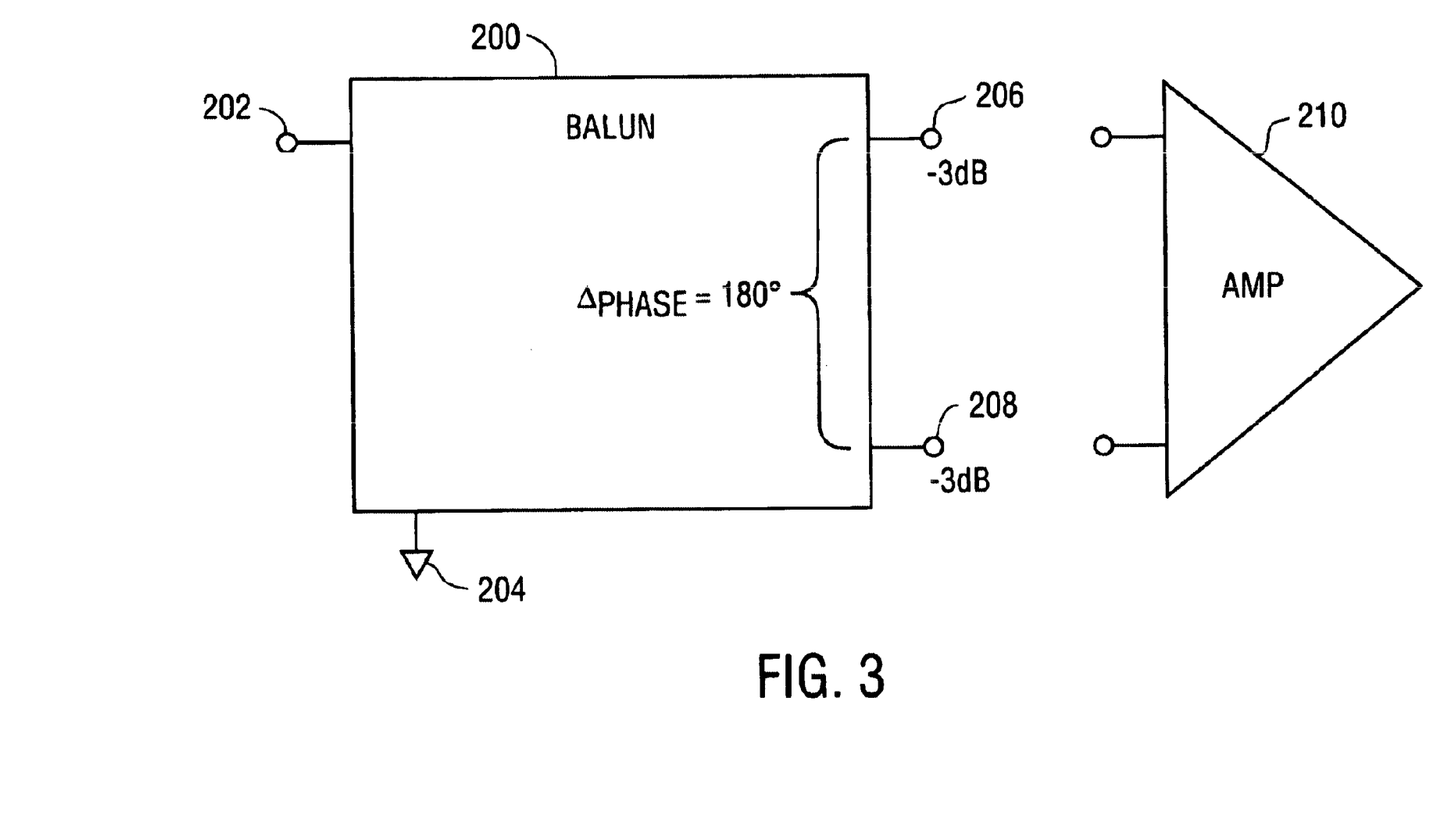
FIG. 3 is a diagram illustrating the design specifications of an exemplary balun.

FIG. 3 is a diagram illustrating the design specifications of an exemplary balun 200 that may incorporate a presently preferred embodiment described herein. The balun 200 includes a single-ended port 202, a first differential port 206, and a second differential port 208. Generally, ground potential 204 will be a common potential reference for the ports 202, 206, 208. Often, baluns such as the balun 200 are used to interface an unbalanced line with an amplifier such as the amplifier 210, AMP of FIG. 3. If such an amplifier interface is made, differential ports 206 and 208 would be coupled to the differential inputs of the amplifier 210. The balun 200 produces signals at the differential ports 206, 208. The design specifications of the balun 200 are that the signals at the differential ports 206, 208 differ in phase by $\Delta_{PHASE}=180$ degrees, or $\pi$ radians, in the ideal case. That is, in the ideal case the signals will have equivalent magnitudes but opposite phase angles. The power transfer of a first signal at the first differential port 206 relative to an input signal at the single-ended port 202 is ideally −3 dB. Similarly, the power transfer of a second signal at the second differential port 208 relative to the input signal at the single-ended port 202 of the balun 200 is ideally −3 dB. The ideal power transfer values represent attenuation of the unbalanced input signal as the input signal is transformed into two balanced output signals. As is well known in the art, the unit of decibel is defined by the following two relationships:

$$\text{Power Transfer (from input to output)} = 10 \, \log_{10} \left| \frac{\text{Output Power}}{\text{Input Power}} \right| \quad (2)$$

$$\text{Voltage/Current (from input to output)} = \quad (3)$$
$$20 \, \log_{10} \left| \frac{\text{Output Voltage/Current}}{\text{Input Voltage/Current}} \right|.$$

Figure 4:
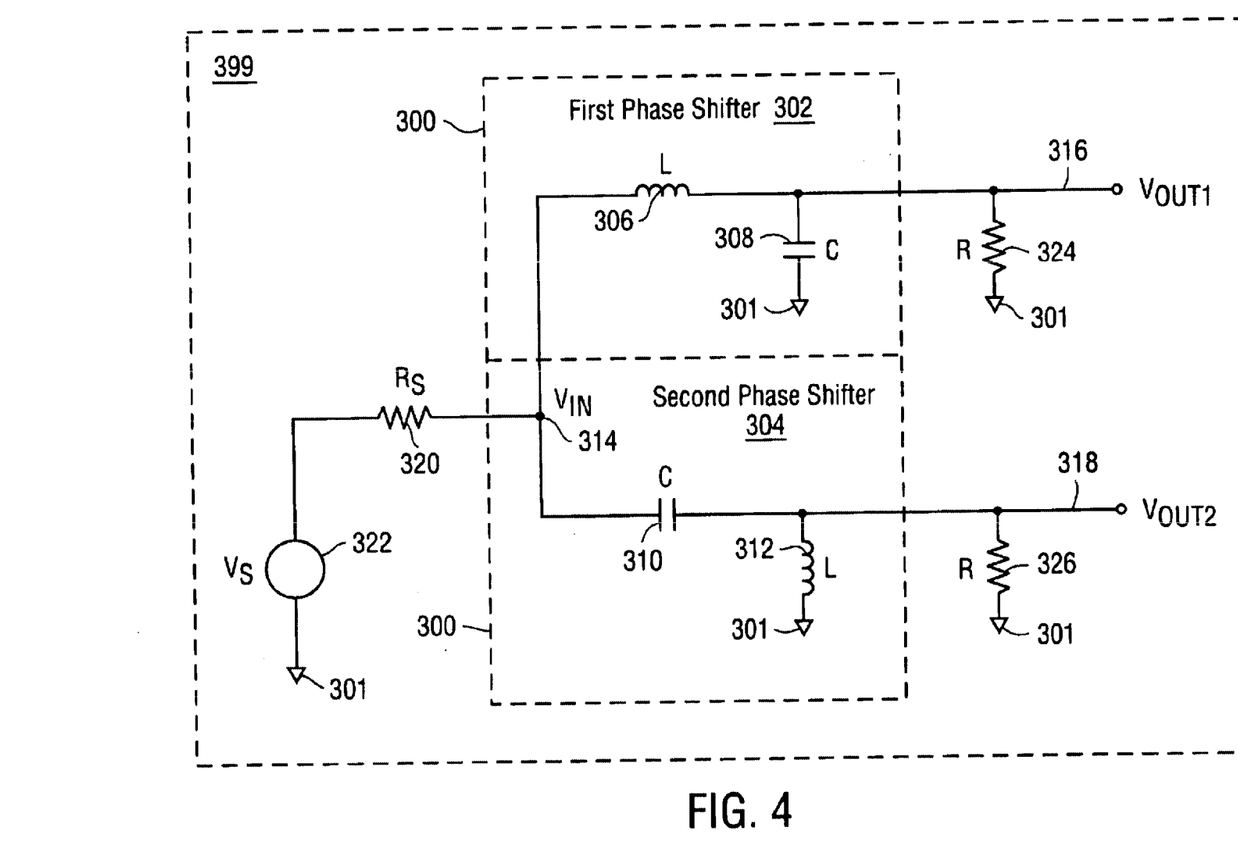
FIG. 4 is a diagram illustrating an exemplary lumped element balun designed according to a presently preferred embodiment.

FIG. 4 is a diagram illustrating a lumped element balun 300 designed according to a presently preferred embodiment and to meet the design specifications illustrated in FIG. 3. The balun 300, which is capable of being produced on a circuit board 399, includes a first phase shifter circuit 302, a second phase shifter circuit 304. As shown in FIG. 4, the balun 300 includes a single-ended port 314, a first differential port 316, and a second differential port 318. FIG. 4 also illustrates a voltage source 322 having a voltage $V_S$ and a series resistor 320 having a resistance $R_S$. The voltage source 322 is connected between a ground potential 301 and one terminal of the series resistor 320. The other terminal of the series resistor 320 is coupled to the lumped element balun 300 at the single-ended port 314. A load resistor 324 having a resistance R is coupled between the first differential port 316 and ground potential 301. A load resistor 326 having resistance R is coupled between the second differential port 318 and ground potential 301. In other embodiments, impedance matching circuitry may be coupled to the balun 300 between the phase shifters 302, 304 and the ports 314, 316, 318. The first phase shifter circuit 302 includes a shunt capacitor 308 having capacitance C and a series inductor 306 having inductance L. The capacitor 308 is coupled to ground potential 301 and the first differential port 316. The inductor 306 is coupled to the first differential port 316 and the single-ended port 314. The first phase shifter circuit 302 causes a positive 90 degree, or $$+\frac{\pi}{2}$$

radian, phase shift in the first output signal voltage $V_{OUT1}$ relative to the input signal voltage $V_{IN}$. The second phase shifter circuit 304 includes a shunt inductor 312 having inductance L and a series capacitor 310 having capacitance C. The inductor 312 is coupled to ground potential 301 and the second differential port 318. The capacitor 310 is coupled to the second differential port 318 and the single-ended port 314. The second phase shifter circuit 304 causes a negative 90 degree, or $$-\frac{\pi}{2}$$

radian, phase shift in the second output signal voltage $V_{OUT2}$ relative to the input signal voltage $V_{IN}$.

A voltage transfer function comparing the first output signal voltage $V_{OUT1}$ to the input signal voltage $V_{IN}$ may be calculated as follows:

$$\frac{V_{OUT1}}{V_{IN}} = \frac{\frac{1}{j\omega C + 1/R}}{\frac{1}{j\omega C + 1/R} + j\omega L} = \frac{1}{1 - \omega^2 LC + j\frac{\omega L}{R}}. \quad (4)$$

Similarly, a voltage transfer function comparing the second output signal voltage $V_{OUT2}$ to the input signal voltage $V_{IN}$ may be calculated as follows:

$$\frac{V_{OUT2}}{V_{IN}} = \frac{\frac{1}{1/j\omega L + 1/R}}{\frac{1}{1/j\omega L + 1/R} + \frac{1}{j\omega C}} = \frac{1}{1 - \frac{1}{\omega^2 LC} - j\frac{1}{\omega RC}}. \quad (5)$$

The transfer function comparing the first output signal voltage $V_{OUT1}$ to the second output signal voltage $V_{OUT2}$ may be calculated as follows:

$$\frac{V_{OUT1}}{V_{OUT2}} = \frac{V_{OUT1}}{V_{IN}} \cdot \frac{V_{IN}}{V_{OUT2}} = \frac{1 - \frac{1}{\omega^2 LC} - j\frac{1}{\omega RC}}{1 - \omega^2 LC - j\frac{\omega L}{R}}. \quad (6)$$

At resonance, the angular frequency $\omega$ is equal to the resonant angular frequency $\omega_0$:

$$\omega = \omega_0 = 1/\sqrt{LC}. \quad (7)$$

This expression can be rewritten as:

$$\omega_0^2 LC = 1 \quad (8)$$

Evaluating equation (6) at the resonant angular frequency and inserting equation (8) into equation (6) yields the following:

$$\left.\frac{V_{OUT1}}{V_{OUT2}}\right|_{\omega=\omega_0} = \frac{1 - \frac{1}{\omega_0^2 LC} - j\frac{1}{\omega_0 RC}}{1 - \omega_0^2 LC - j\frac{\omega_0 L}{R}} = \quad (9)$$

$$\frac{1 - \frac{1}{1} - j\frac{1}{\omega_0 RC}}{1 - 1 + j\frac{\omega_0 L}{R}} = \frac{0 - j\frac{1}{\omega_0 RC}}{0 + j\frac{\omega_0 L}{R}} = -\frac{1}{\omega_0^2 LC} = -1$$

$$|V_{OUT2}|_{\omega=\omega_0} = |V_{OUT1}|_{\omega=\omega_0} \quad (10)$$

$$\angle V_{OUT2}|_{\omega=\omega_0} = \angle V_{OUT1}|_{\omega=\omega_0} + 180° = \angle V_{OUT1}|_{\omega=\omega_0} + \pi \quad (11)$$

The result in equation (9) leads to the conditions in equations (10) and (11). The conditions state that, at the resonant frequency, the magnitude of the first output signal voltage $V_{OUT1}$ is equivalent to the magnitude of the second output signal voltage $V_{OUT2}$, and that the signals are 180 degrees out of phase with respect to each other. These are the performance criteria required in a balun at a desired operating frequency.

As is known in the art, the relationship between the transmission distances of a circuit and the wavelength at the frequency of interest generally determines whether it is appropriate in terms of performance to use lumped elements or distributed elements. As will be familiar to those skilled in the art, a lumped element is an electrical element where the physical size of the element is small relative to the wavelength at the operating frequency of the element. A lumped element is, for example, a resistor, a capacitor, or an inductor, manufactured, for example, in a discrete package. An example of an all-lumped balun is the balun 300 of FIG. 4. A distributed element is an electrical element where the physical size of the element is comparable to the wavelength at the operating frequency of the element. A distributed element is, for example, an ideal transmission line or waveguide. A transmission line may be implemented as a microstrip line running over a dielectric and a ground plane, or a stripline, for example. An example of an all-distributed balun is the rat race microstrip balun 100 of FIG. 1.

In order to determine values for the inductors 306, 312 and the capacitors 308, 310 of the lumped balun 300 of FIG. 4 at a microwave frequency of interest, the proposed operating frequency is inserted into equation (7). As an example, a lumped-distributed balun is designed to operate at a frequency of 5.25 gigahertz (GHz) or 5250 megahertz (MHz). Of course, a wide variety of frequencies may be selected as suitable for the application and 5.25 GHz is an exemplary value. Generally, a balun according to the presently preferred embodiments described herein may be designed to operate at a frequency of 2 GHz or above.

$$\omega_0 = 2\pi f_0 = 2\pi \cdot (5.25 \times 10^9 \text{ Hz}) \cong 3.3 \times 10^{10} \text{ rad/sec} = 1/\sqrt{LC}. \quad (12)$$

Inserting an exemplary value for the capacitance C of 1 picoFarad (pF) into equation (12) yields the following result for L:

$$L \cong (1 \times 10^{-12} \text{ pF})/(3.3 \times 10^{10})^2 \cong 0.918 \text{ nanoHenries (nH)}. \quad (13)$$

A difficulty with implementing the all-lumped balun 300 at microwave frequencies arises when a designer attempts to find discrete components having values small enough to meet the demands of the application while not being prohibitively expensive. For example, an inductor of, for example, approximately 1 nH is expensive and difficult to obtain as a discrete element.

Figure 5:
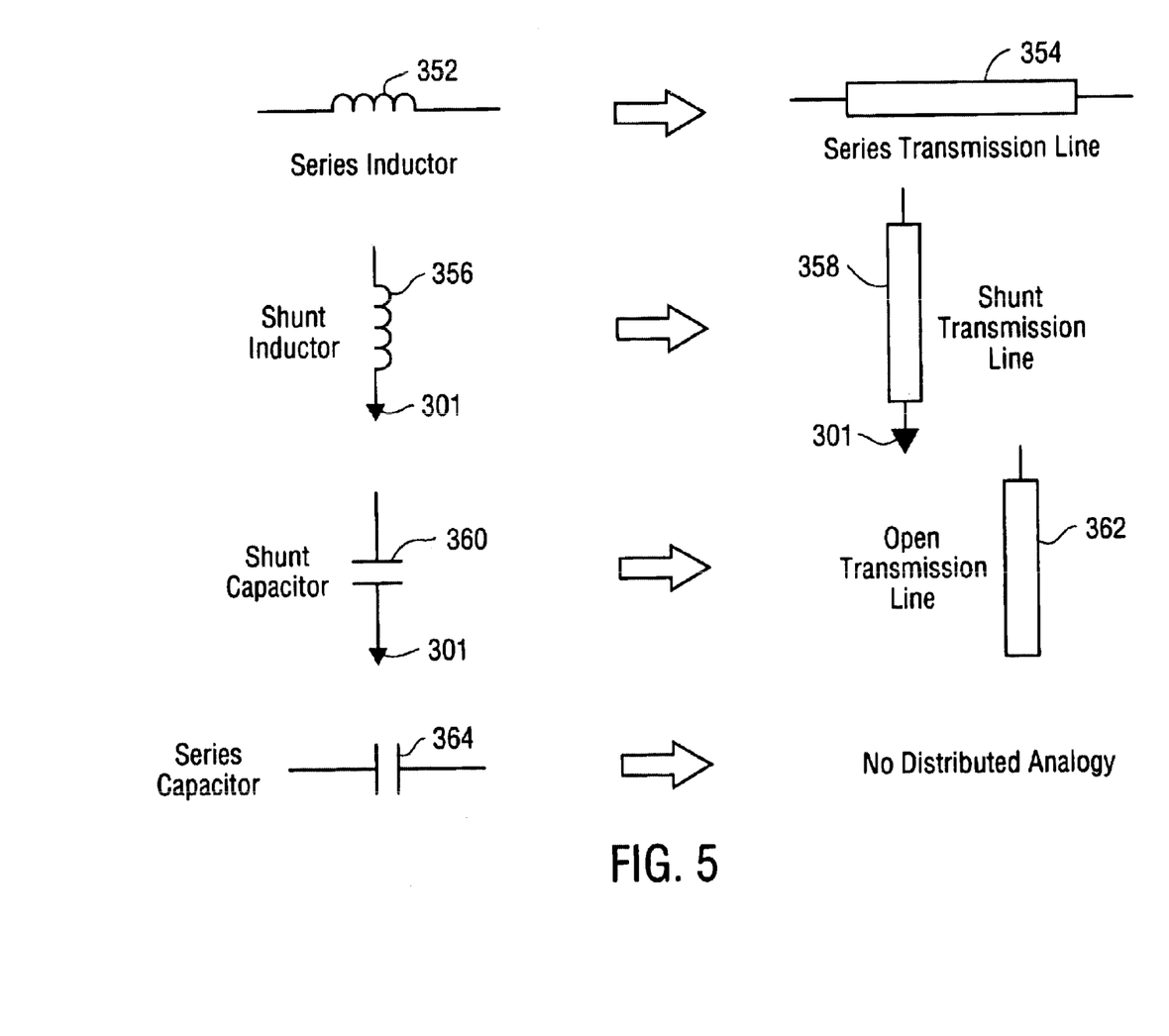
FIG. 5 is a diagram illustrating the conversion of lumped elements to distributed elements where applicable.

FIG. 5 is a diagram illustrating the conversion of lumped elements to distributed elements where applicable. A series transmission line 354 may replace a series-connected inductor 352. A shunt inductor 356, that is, an inductor coupled to ground potential 301, may be replaced with a shunt transmission line 358, or a transmission line coupled to ground potential 301. A shunt capacitor 360, that is, a capacitor coupled to ground potential 301, may be replaced with an open circuited transmission line 362. There is no distributed analogy for a series-connected capacitor 364.

Figure 6:
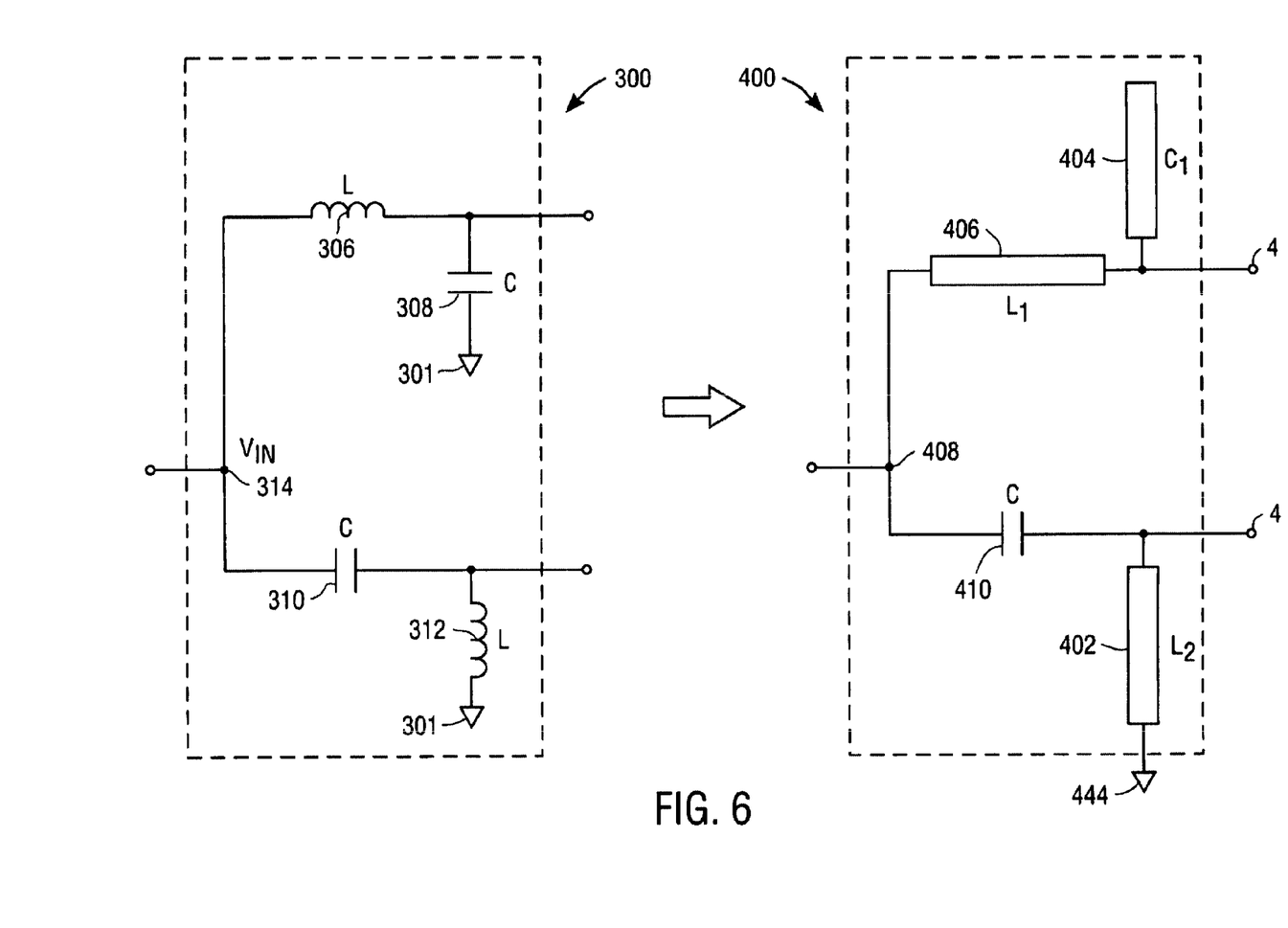
FIG. 6 is a diagram illustrating the conversion of the exemplary lumped element balun of FIG. 4 to an exemplary lumped-distributed balun according to a presently preferred embodiment.

FIG. 6 is a diagram illustrating the conversion of the exemplary lumped element balun 300 of FIG. 4 to an exemplary lumped-distributed balun 400 according to a presently preferred embodiment. The balun 400 includes a transmission line 406 connected in series, an open-circuited transmission line 404, a lumped element capacitor 410 having capacitance C, a transmission line 402 coupled to ground potential 444, a single-ended port 408, a first differential port 416, and a second differential port 418. The transmission lines 402, 404, 406 exhibit an inductance or a capacitance as applicable based in part on the width and length dimensions of the transmission lines 402, 404, 406. The lengths and widths will be determined according to the approximate inductive or capacitive values required for proper balun 400 performance at the desired operating frequency, for example, at 5.25 GHz. The open-circuited transmission line 404 is coupled to the first differential port 416 and has a capacitance value $C_1 \equiv C$, replacing the shunt capacitor 308. The series-connected transmission line 406 is coupled to the first differential port 416 and the single-ended port 408 and has an inductance value $L_1 \equiv L$, replacing the series inductor 306. The transmission line 402 is coupled to the second differential port 418 and ground potential 444 and has an inductance value $L_2 \equiv L \equiv L_1$, replacing the shunt inductor 312.

For efficient power transfer from the input port to the output ports, and to achieve effective matching at the input and output ports, of the balun 400, preferably matching networks are added at the input and output ports of the balun 400.

Figure 7:
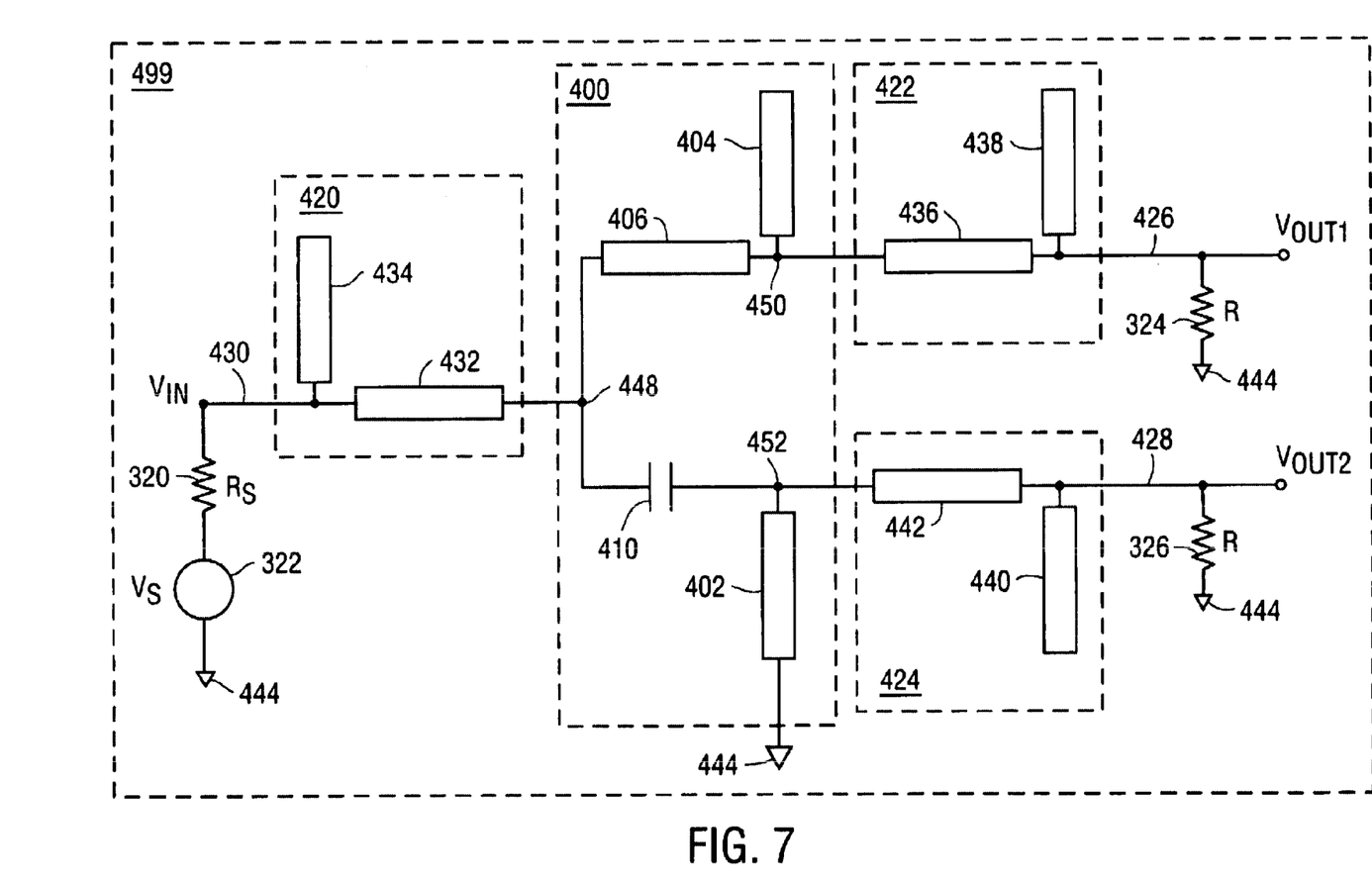
FIG. 7 is a diagram illustrating the exemplary lumped-distributed balun of FIG. 6 with accompanying exemplary impedance matching circuitry that couples the exemplary balun with input and output impedances.

FIG. 7 is a diagram illustrating the exemplary lumped-distributed balun 400 of FIG. 6 with accompanying exemplary impedance matching circuitry 420, 422, 424 that couples the exemplary balun 400 with input and output impedances, which are all capable of being produced on a circuit board 499. FIG. 7 also illustrates the voltage source 322 having a voltage $V_S$ and the series resistor 320 having a resistance $R_S$. The voltage source 322 is connected between a ground potential 444 and one terminal of the series resistor 320. The balun 400 is coupled to the other terminal of the series resistor 320 by an input matching circuit 420. The series resistor 320 is coupled to the input matching circuit 420 at a single-ended port 430 at which a voltage signal VIN is presented to the input matching circuit 420. The load resistor 324 having a resistance R is coupled between a first output matching circuit 422 at a first differential port 426 at which a first output voltage signal $V_{OUT1}$ is present, and ground potential 444. The load resistor 326 having a resistance R is coupled between a second output matching circuit 424 at a second differential port 428 at which a second output voltage signal $V_{OUT2}$ is present, and ground potential 444. The balun 400 includes a transmission line 406 connected in series, an open-circuited transmission line 404, a lumped element capacitor 410 having capacitance C, a transmission line 402 coupled to ground potential 444.

The input matching circuit 420 includes a transmission line 432 connected in series and an open-circuited transmission line 434. The transmission line 432 is coupled to the series resistor 320 and the open-circuited transmission line 434 at the single-ended port 430, and to the transmission line 406 and the lumped capacitor 410 of the balun 400 at a node 448. The first output matching circuit 422 includes a transmission line 436 connected in series and an open-circuited transmission line 438. The transmission line 436 is coupled to the load resistor 324 and the open-circuited transmission line 438 at the first differential port 426, and to the transmission line 406 and the open-circuited transmission line 404 of the balun 400 at a node 450. The second output matching circuit 424 includes a transmission line 442 connected in series and an open-circuited transmission line 440.

The transmission line 442 is coupled to the load resistor 326 and the open-circuited transmission line 440 at the second differential port 428, and to the lumped capacitor 410 and the transmission line 402 of the balun 400 at a node 452. Although the matching circuits 420, 422, 424 are shown as distinct from the balun 400 in FIG. 7, in other embodiments the balun 400 includes the matching circuits 420, 422, 424.

The transmission lines 402, 404, 406, 432, 434, 436, 438, 440, 442 of FIG. 7 are preferably implemented as microstrip lines. A generalized microstrip line has a length d, a width w, and is fabricated above a dielectric material having a height of h. As is known in the art, microstrip includes a metal strip line, a dielectric material, and a metal ground plane. The metal strip line in microstrip may include copper, for example, or any other suitable metal. In microstrip, the dimensions of the strip line define the waveguide that the strip line creates with the ground plane. Of course, other distributed element implementations, or transmission line structures, such as stripline, may be used where suitable.

Continuing with the design example presented above with reference to FIG. 4, the lumped-distributed balun 400 is designed to operate at a frequency of 5.25 gigahertz (GHz) or 5250 megahertz (MHz). Of course, a wide variety of frequencies may be selected as suitable for the application and 5.25 GHz is an exemplary value. Generally, the balun 400 may be designed to operate at a frequency of 2 GHz or above.

Referring to equations (12) and (13), the exemplary values for the capacitance C was selected to be 1 pF and the inductance L was found to be approximately 0.918 nH. As is known to those skilled in the art, various simulation programs are capable of approximating the dimensions, of a microstrip or another type of transmission line, that are required to achieve a particular inductance or capacitance value given, for example, the relative permittivity and the height of the dielectric. Such simulation programs utilize well-known approximation equations to calculate the characteristic impedance of the microstrip, taking into account fringing and other effects, and thus the inductance and the capacitance of the microstrip.

Table I shows the results of a computer simulation run using a standard RF circuit simulation software package, as well as the assumed values for various elements utilized in FIG. 7. The values for the dimensions of the transmission lines (TLs) 402, 404, 406, 432, 434, 436, 438, 440, 442 of FIG. 7 were obtained through iterative optimization using the software package. A prototype implementation of the circuit of FIG. 7 utilizes a standard National Electrical Manufacturers Association grade FR4 circuit board with a height of 20 mils as the dielectric material. The FR4 circuit board has a relative permittivity of approximately 4.25.

TABLE I

Simulation results for the circuit of FIG. 7; including dimensions of transmission line elements

| FR4 circuit board Source and load resistances Transmission line (TL) | Value $\epsilon_R \approx 4.25$ height h = 20 mil $R_S = R = 50$ Ohms (Ω) | |
|---|---|---|
| | Width w (mils) | Length d (mils) |
| TL 402 | 20 | 80 |
| TL 404 | 36 | 218 |
| TL 406 | 20 | 80 |
| TL 432 | 39 | 100 |
| TL 434 | 20 | 200 |
| TL 436 | 20 | 80 |

TABLE I-continued

Simulation results for the circuit of FIG. 7;
including dimensions of transmission line elements

| FR4 circuit board | Value | |
|---|---|---|
| Source and load resistances | $\epsilon_R \approx 4.25$ | |
| | height h = 20 mil | |
| Transmission line (TL) | $R_S = R = 50$ Ohms (Ω) | |
| | Width w (mils) | Length d (mils) |
| TL 438 | 15 | 200 |
| TL 440 | 15 | 200 |
| TL 442 | 20 | 80 |

Figure 8:
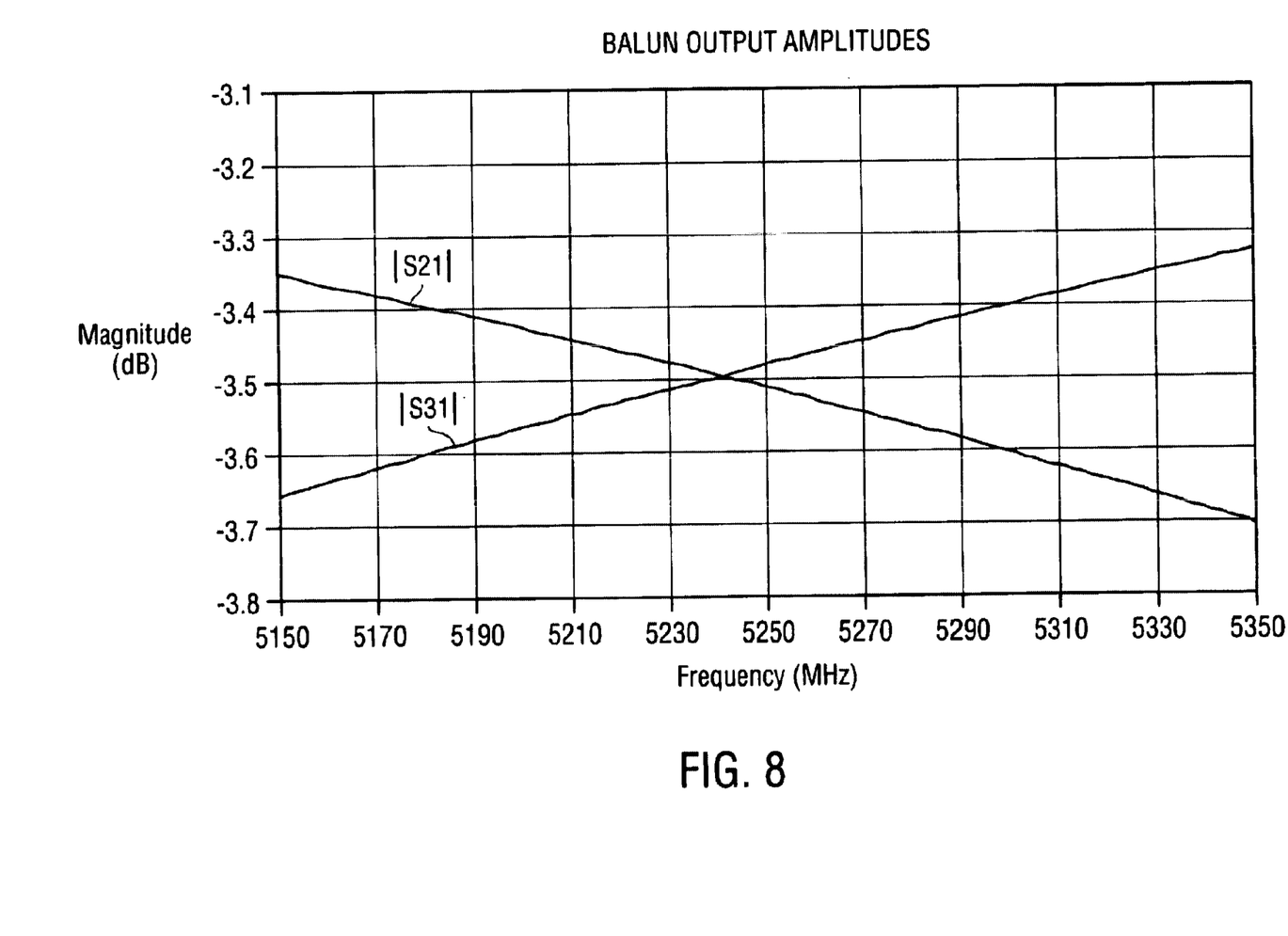
FIG. 8 is a graph illustrating performance characteristics relating to signal attenuation at and power transfer to the differential ports for the exemplary balun of FIG. 7.

FIG. 8 is a graph illustrating performance characteristics relating to signal attenuation at and power transfer to the differential ports for the exemplary balun 400 of FIG. 7. In FIG. 8, on the vertical scale, $|S_{21}|$ represents the power transfer from the single-ended port 430 to the first differential port 426 of FIG. 7. $|S_{31}|$ represents the power transfer from the single-ended port 430 to the second differential port 428 of FIG. 7. Both $|S_{21}|$ and $|S_{31}|$ are measured in units of decibels (dB) according to equation (2) and are graphed against frequency on the horizontal scale. $|S_{21}|$ and $|S_{31}|$ characterize the attenuation of the input signal $V_{IN}$ at the respective differential ports 426, 428. In a neighborhood of the operating frequency f=5.25 GHz, the amplitude losses are comparable to the losses associated with the prior art ring balun 100 of FIG. 1 (i.e., −3.3 to −3.5 dB).

Figure 9:
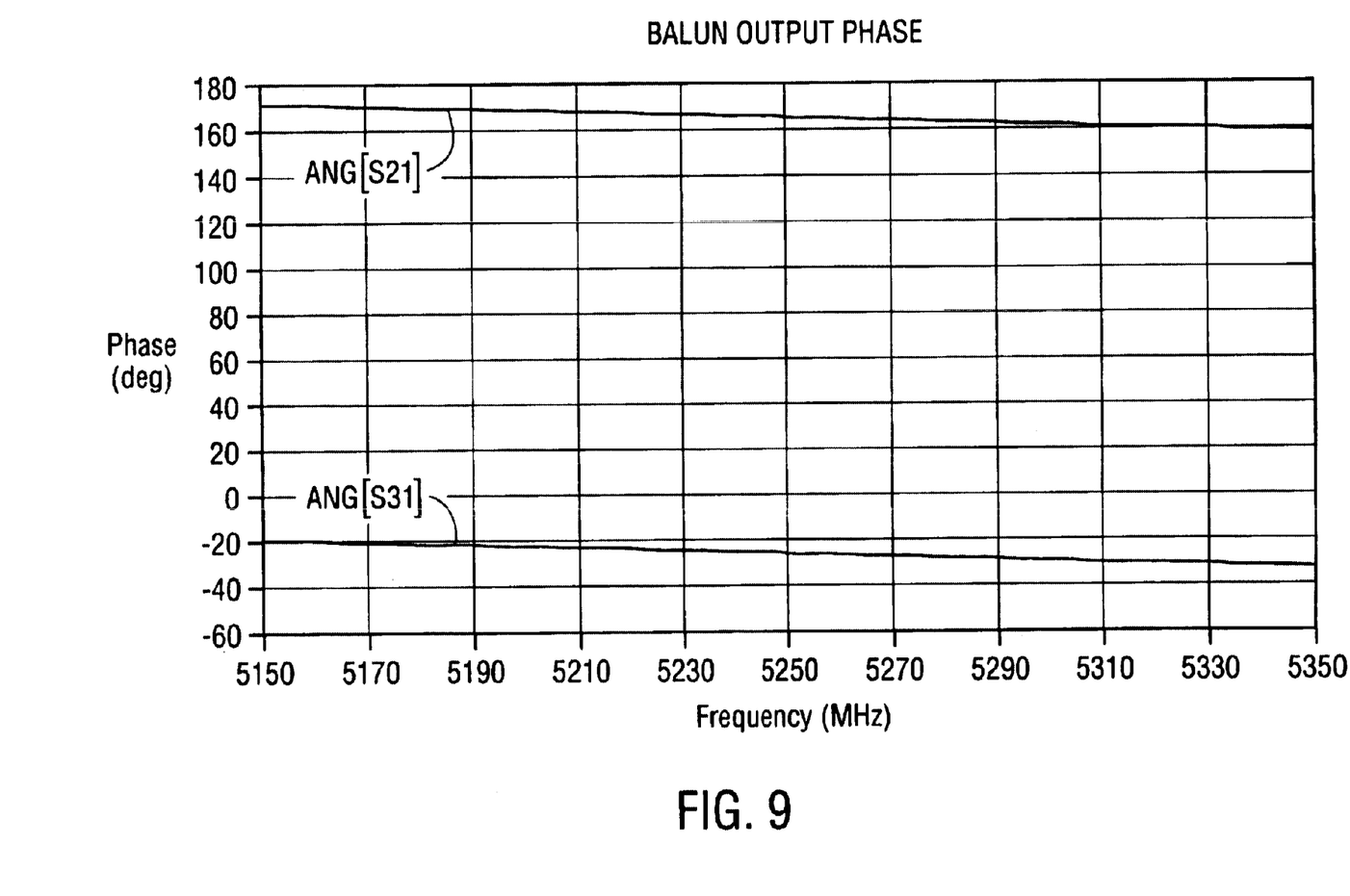
FIG. 9 is a graph illustrating performance characteristics relating to phase values at the differential ports for the exemplary balun of FIG. 7.

FIG. 9 is a graph illustrating performance characteristics relating to phase values at the differential ports for the exemplary balun 400 of FIG. 7. The phase angle of $S_{21}$ is denoted as ANG[$S_{21}$], while the phase angle of $S_{31}$ is denoted as ANG[$S_{31}$]. The phase angle of $S_{21}$ and the phase angle of $S_{31}$ are measured in units of degrees and are graphed against frequency on the horizontal scale.

In addition to substantially reducing the requirements for space on a printed circuit board, the balun 400 of FIG. 7 also satisfies desirable performance conditions. From FIG. 8, $|S_{21}|$ at the operating frequency of 5.25 GHz equals approximately −3.52 dB, while $|S_{31}|$ equals approximately −3.48 dB. For an ideal balun, where there is no attenuation loss, $|S_{21}|$ and $|S_{31}|$ are equal to −3 dB. From FIG. 9, the phase angle of $S_{21}$ at the operating frequency of 5.25 GHz equals approximately 164.7 degrees, while the phase angle of $S_{31}$ equals approximately −26.6 degrees. The phase difference between the phase angles of S21 and of S31 is approximately 181.3 degrees. For an ideal balun, the phase difference is 180 degrees.

In a balun such as balun 400 that is actually implemented, circuit board losses and metal losses can often total up to 1 dB. The balun 400 exhibits about 0.5 dB of loss at each differential output and a mismatch in phase of about 1.3 degrees. As is well known to those skilled in the art, deviations of these magnitudes from the ideal case are tolerable for many, if not most, balun applications. As such, the presently preferred embodiment of the balun described herein offers an excellent trade-off between performance and other factors, such as fabrication cost and the area taken up by the balun on a printed circuit board.

As used herein, the term transmission line structure or transmission line is intended to refer to a distributed element such as a microstrip, for example. A transmission line structure or transmission line also encompasses a stripline. As is known in the art, a stripline is a strip of metal, for example, copper, sandwiched between two ground planes and a dielectric material. Most broadly, a transmission line structure refers to any suitable implementation that may be modeled as a transmission line.

The balun described herein according to the presently preferred embodiment satisfies performance requirements while minimizing the corresponding area required on a circuit board. The lumped-distributed balun is preferably printed on a circuit board to optimize the covered space. The lumped-distributed balun is designed to perform at a prescribed operating frequency including microwave frequencies. The lumped-distributed balun satisfies performance criteria for signal attenuation and return loss.

Although the present invention has been particularly described with reference to the preferred embodiments, it should be readily apparent to those of ordinary skill in the art that changes and modifications in the form and details may be made without departing from the spirit and scope of the invention. It is intended that the appended claims include such changes and modifications.

What is claimed is:

1. A lumped-distributed balun, comprising:
   a single-ended port;
   a first differential port;
   a second differential port;
   a first phase shifter circuit, comprising:
     a first inductor coupled to the single-ended port and the first differential port; and
     a first capacitor coupled to the first differential port and adapted to be coupled to
   ground potential, wherein at least one of the first inductor and the first capacitor is
   implemented as a first transmission line structure; and
   a second phase shifter circuit, comprising:
     a second inductor coupled to the second differential port and adapted to be coupled to ground potential; and
     a second capacitor coupled to the single-ended port and the second differential port, wherein the second inductor is implemented as a second transmission line structure and the second capacitor is implemented as a lumped element.

2. The balun according to claim 1, wherein the second inductor has an inductance value of approximately 1 nano-Henry.

3. The balun according to claim 1, wherein the first inductor is implemented as a first microstrip.

4. The balun according to claim 3, wherein the first capacitor coupled to the first differential port and adapted to be coupled to ground potential is implemented as a second microstrip, wherein the second microstrip is open-circuited and coupled to the first differential port.

5. The balun according to claim 4, wherein the second transmission line structure comprises a third microstrip.

6. The balun according to claim 4, wherein the first microstrip, the second microstrip, and the third microstrip include copper.

7. The balun according to claim 1, wherein the first and second transmission line structures include copper.

8. The balun according to claim 1, wherein the first inductor is implemented as a first stripline.

9. The balun according to claim 8, wherein the first capacitor is implemented as a second stripline.

10. The balun according to claim 9, wherein the second transmission line structure comprises a third stripline.

11. The balun according to claim 1, wherein the first transmission line structure comprises a microstrip.

12. The balun according to claim 1, wherein the first transmission line structure comprises a stripline.

13. The balun according to claim 1, wherein the lumped element has a capacitance value of approximately 1 pico-Farad.

14. The balun according to claim 1, wherein the difference in phase between a first signal and a second signal, the first signal appearing at the first differential port, the second signal appearing at the second differential port, is approximately 180 degrees, the first and second signals adapted to be measured relative to ground potential.

15. The balun according to claim 1, wherein an unbalanced input signal is presented at the single-ended port.

16. The balun according to claim 1, wherein the balun operates at a frequency of approximately 5.25 GHz.

17. The balun according to claim 1, wherein the balun is fabricated on a printed circuit board.

18. The balun according to claim 1, wherein the first phase shifter circuit produces an approximate 90 degree signal phase shift from the single-ended port to the first differential port.

19. The balun according to claim 1, wherein the second phase shifter circuit produces an approximate 270 degree signal phase shift from the single-ended port to the second differential port.

20. A method of designing a printed lumped-distributed balun, comprising:

configuring a first network, the first network being comprised of lumped elements, to satisfy balun performance criteria, the criteria comprising a requirement that signal outputs are approximately 180 degrees out of phase;

determining impedance values for the first network at an operating frequency; and configuring a second network in accordance with the impedance values by replacing at least one of the lumped elements in the first network with a distributed element and by retaining at least one lumped element from the first network.

21. The method according to claim 20, wherein the step of configuring the second network further comprises:

replacing a lumped element inductor of the first network with the distributed element, the lumped element inductor coupled between ground potential and a lumped element capacitor of the first network; and retaining the lumped element capacitor from the first network.

* * * * *